US010340417B2

United States Patent
Choi et al.

(10) Patent No.: US 10,340,417 B2
(45) Date of Patent: Jul. 2, 2019

(54) SEMICONDUCTOR DEVICE, SEMICONDUCTOR DEVICE PACKAGE, AND LIGHTING SYSTEM COMPRISING SAME

(71) Applicant: LG INNOTEK CO., LTD., Seoul (KR)

(72) Inventors: Jae Hoon Choi, Seoul (KR); Hae Jin Park, Seoul (KR); Rak Jun Choi, Seoul (KR); Byeoung Jo Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/768,282

(22) PCT Filed: Oct. 14, 2016

(86) PCT No.: PCT/KR2016/011576
§ 371 (c)(1),
(2) Date: Apr. 13, 2018

(87) PCT Pub. No.: WO2017/065566
PCT Pub. Date: Apr. 20, 2017

(65) Prior Publication Data
US 2018/0315887 A1    Nov. 1, 2018

(30) Foreign Application Priority Data

Oct. 15, 2015 (KR) .................. 10-2015-0144060

(51) Int. Cl.
*F21K 9/232*    (2016.01)
*H01L 33/06*    (2010.01)
(Continued)

(52) U.S. Cl.
CPC .............. *H01L 33/12* (2013.01); *H01L 33/20* (2013.01); *H01L 33/22* (2013.01); *H01L 33/46* (2013.01);
(Continued)

(58) Field of Classification Search
CPC ......... H01L 33/12; H01L 33/20; H01L 33/46; H01L 33/60
(Continued)

(56) References Cited

U.S. PATENT DOCUMENTS 9,153,741 B1    10/2015 Hirayama et al.
2012/0080660 A1*  4/2012 Jung ................. H01L 33/02
257/13

(Continued)

FOREIGN PATENT DOCUMENTS

JP    2010219269    9/2010
JP    2012-235122   11/2012
(Continued)

OTHER PUBLICATIONS

International Search Report (with English Translation) and Written Opinion dated Jan. 31, 2017 issued in Application No. PCT/KR2016/011576.
(Continued)

*Primary Examiner* — Bo Fan
(74) *Attorney, Agent, or Firm* — Ked & Associates LLP

(57) ABSTRACT

A semiconductor device according to an embodiment comprises: a substrate; a buffer layer provided on the substrate; a first conductivity type semiconductor layer provided on the buffer layer; a second conductivity type semiconductor layer; a light emitting structure, provided between the first conductivity type semiconductor layer and the second conductivity type semiconductor layer, comprising an active layer which emits ultraviolet light; and a plurality of air voids provided within the buffer layer, wherein the air voids can be formed to have two or more inclined surfaces.

20 Claims, 14 Drawing Sheets

(51) Int. Cl.
    *H01L 33/12*         (2010.01)
    *H01L 33/20*         (2010.01)
    *H01L 33/22*         (2010.01)
    *H01L 33/32*         (2010.01)
    *H01L 33/40*         (2010.01)
    *H01L 33/46*         (2010.01)
    *H01L 33/60*         (2010.01)
    *H01L 33/62*         (2010.01)
    *F21Y 115/10*       (2016.01)

(52) U.S. Cl.
    CPC .............. *H01L 33/60* (2013.01); *H01L 33/62* (2013.01); *F21K 9/232* (2016.08); *F21Y 2115/10* (2016.08); *H01L 33/06* (2013.01); *H01L 33/32* (2013.01); *H01L 33/40* (2013.01); *H01L 2933/0091* (2013.01)

(58) Field of Classification Search
    USPC .............................. 257/98, 774, 13; 438/107
    See application file for complete search history.

(56) References Cited

U.S. PATENT DOCUMENTS

2012/0187445 A1     7/2012     Oh et al.
2012/0273755 A1     11/2012    Wei et al.
2013/0193476 A1     8/2013     Diana et al.
2014/0070165 A1*   3/2014     Park .................. H01L 21/02458
                                                      257/13
2015/0099348 A1     4/2015     Lee et al.
2015/0214129 A1*   7/2015     Kawakita ................ H01L 24/97
                                                       257/98
2015/0372190 A1    12/2015    Hirayama

FOREIGN PATENT DOCUMENTS

| JP | 2013-539922 | 10/2013 |
| KR | 10-2011-0114183 | 10/2011 |
| KR | 10-2012-0079392 | 7/2012 |
| KR | 10-2013-0072825 | 7/2013 |
| KR | 10-2013-0099529 | 9/2013 |
| KR | 10-2014-0034665 | 3/2014 |
| KR | 10-2015-0040660 | 4/2015 |
| WO | WO 2014069235 | 5/2014 |

OTHER PUBLICATIONS

European Search Report dated Sep. 11, 2018 issued in Application No. 16855783.3.

* cited by examiner

FIG. 6
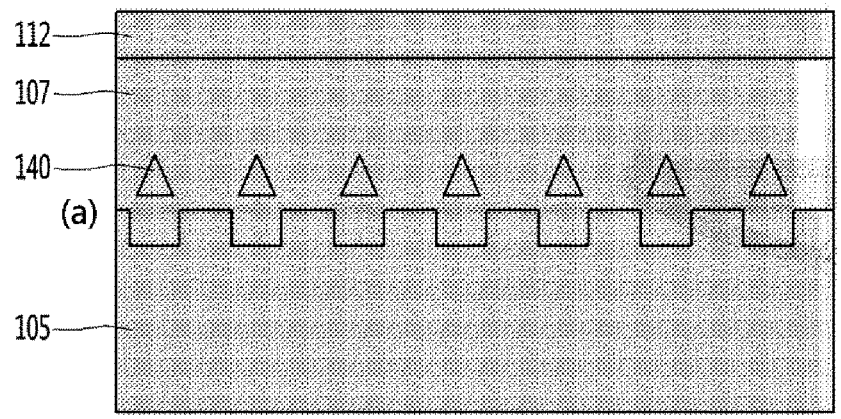
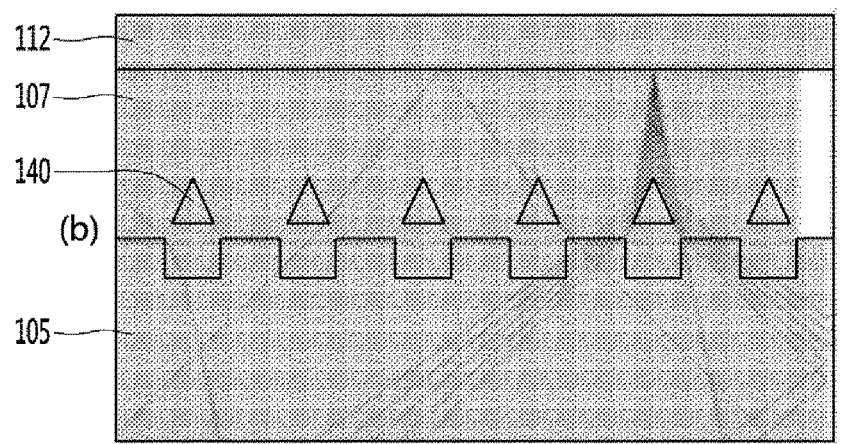
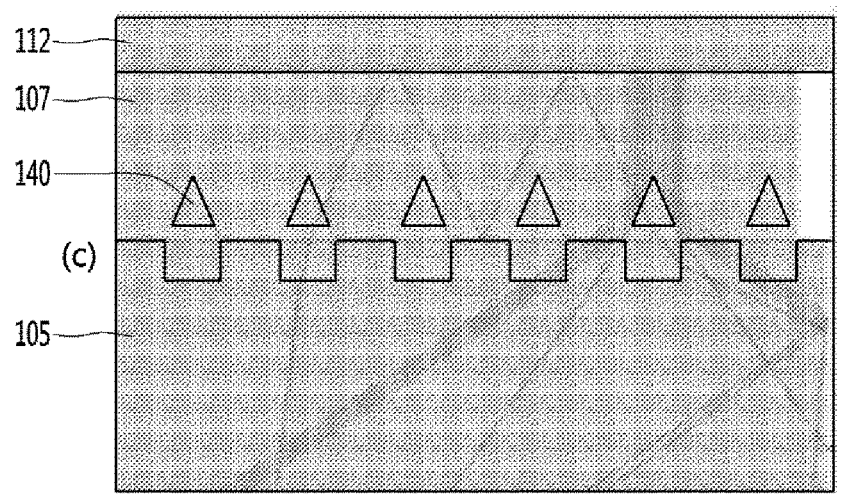

FIG. 7
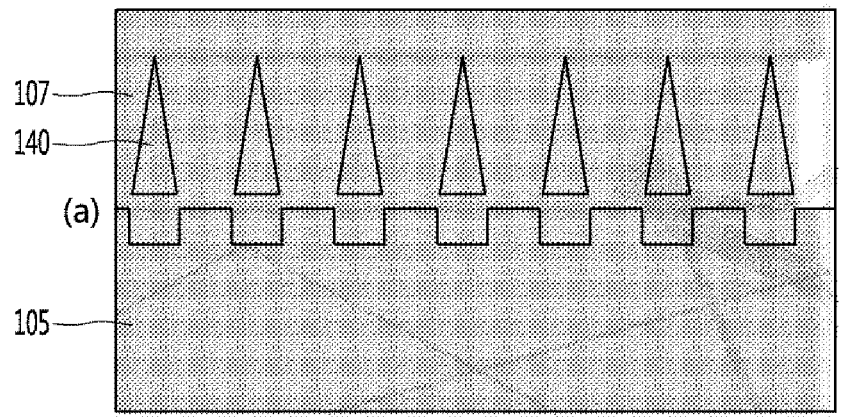
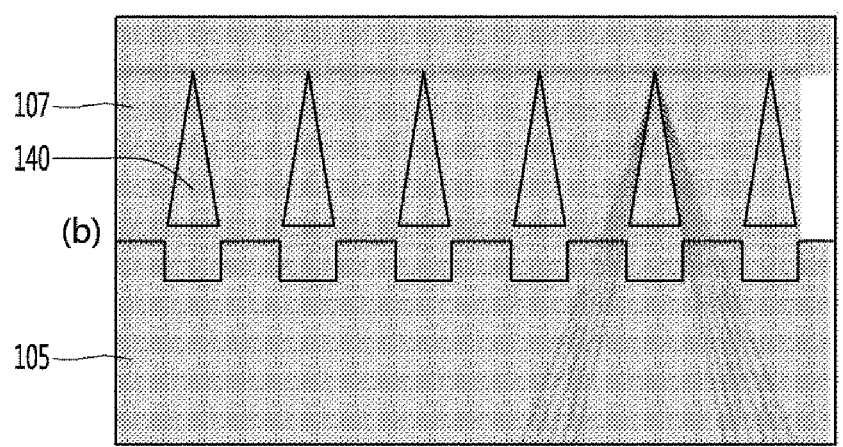
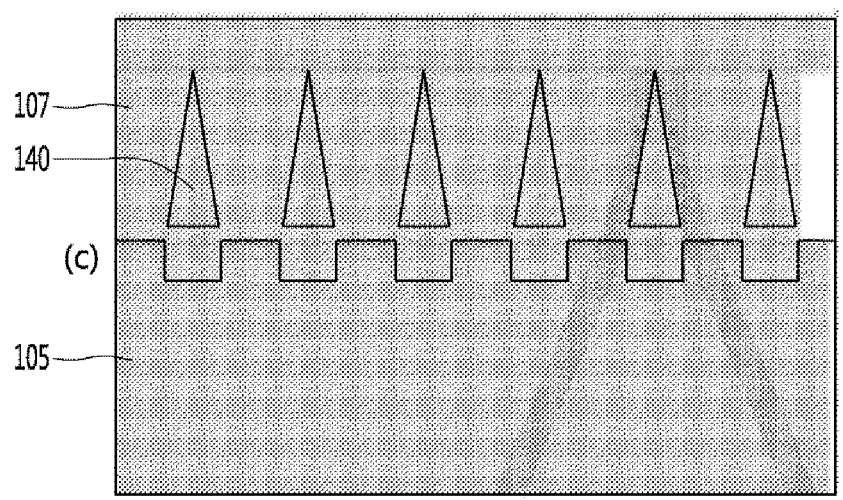

SEMICONDUCTOR DEVICE, SEMICONDUCTOR DEVICE PACKAGE, AND LIGHTING SYSTEM COMPRISING SAME

CROSS-REFERENCE TO RELATED PATENT APPLICATIONS

This application is a U.S. National Stage Application under 35 U.S.C. § 371 of PCT Application No. PCT/KR2016/011576, filed Oct. 14, 2016, which claims priority to Korean Patent Application No. 10-2015-0144060 filed Oct. 15, 2015, whose entire disclosures are hereby incorporated by reference.

TECHNICAL FIELD

The embodiment relates to a semiconductor device, a semiconductor device package, and a lighting system including the same.

BACKGROUND ART

Generally, a light emitting diode (LED) includes a p-n junction diode having a characteristic of converting electric energy into light energy. The p-n junction diode can be formed by combining group III-V elements of the periodic table. The light emitting device can represent various colors by adjusting the compositional ratio of compound semiconductors.

When a forward voltage is applied to an LED, electrons of an N layer are combined with holes of a P layer, so that energy corresponding to an energy gap between a conduction band and a valance band may be released. This energy is mainly realized as heat or light, and the LED emits the energy as the light.

A nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been commercialized and extensively used.

An ultraviolet light emitting device (UV LED) is a light emitting device of emitting light having the wavelength in the range of 200 nm to 400 nm. The ultraviolet light emitting device includes a short wavelength and a long wavelength depending on the usage thereof. The short wavelength may be used for sterilization or purification and the long wavelength may be used in an exposing device and a curing device.

Meanwhile, the ultraviolet light emitting device may have a problem in which light extraction efficiency may be degraded due to the total reflection on the interfacial surface between the buffer layer and a sapphire substrate. In order to improve the light extraction efficiency, the attempts have been made to form air voids. However, the control of the air voids is difficult.

DISCLOSURE

Technical Problem

The embodiment is to provide a semiconductor device, a semiconductor device package, and a lighting system, in which voids are provided in an upper portion of a concavo-convex pattern and have uniform shapes and sizes.

Technical Solution

According to the embodiment, an ultraviolet semiconductor device includes a substrate, a buffer layer provided on the substrate, a light emitting structure provided on the buffer layer and including a first conductive semiconductor layer, a second conductive semiconductor layer, and an active layer interposed between the first conductive semiconductor layer and the second conductive semiconductor layer to emit an ultraviolet light, and a plurality of air voids provided in the buffer layer. The air void may have at least two inclined facets.

In addition, according to the embodiment, the semiconductor device includes a substrate, a buffer layer provided at one side of the substrate, a void provided in the buffer layer and having at least two inclined facets, a light emitting structure provided at one side of the buffer layer and including a first conductive semiconductor layer, an active layer, and a second conductive semiconductor layer, a sub-mount provided in opposition to the substrate, at least one bump interposed between the light emitting structure and the sub-mount, at least one contact layer interposed between the at least one bump and the light emitting structure, at least one spread layer interposed between the at least one contact layer and the at least one bump, and at least one contact separation layer arranged between the light emitting structure and the spread layer to separate the at least one contact layer into a plurality of contact layers electrically isolated from each other.

Advantageous Effects

According to the embodiment, the voids are provided above the concavo-convex pattern to block the threading dislocations, thereby improving the quality of epitaxial growth of the light emitting device.

According to the embodiment, a plurality of voids having the uniform shape and size may be provided above the concavo-convex pattern to induce light scattering, thereby increasing light extraction efficiency.

According to an embodiment, the void having the inclined facet with the specific slope is provided above the concavo-convex pattern, thereby enhancing the orientation angle.

According to an embodiment, the light efficiency of the light emitting device having the flip chip bonding structure may be improved by adjusting the height of the void.

DESCRIPTION OF DRAWINGS

FIGS. 6 and 7 are partial enlarged views of the semiconductor device according to another embodiment.

BEST MODE

Mode for Invention

Figure 1:
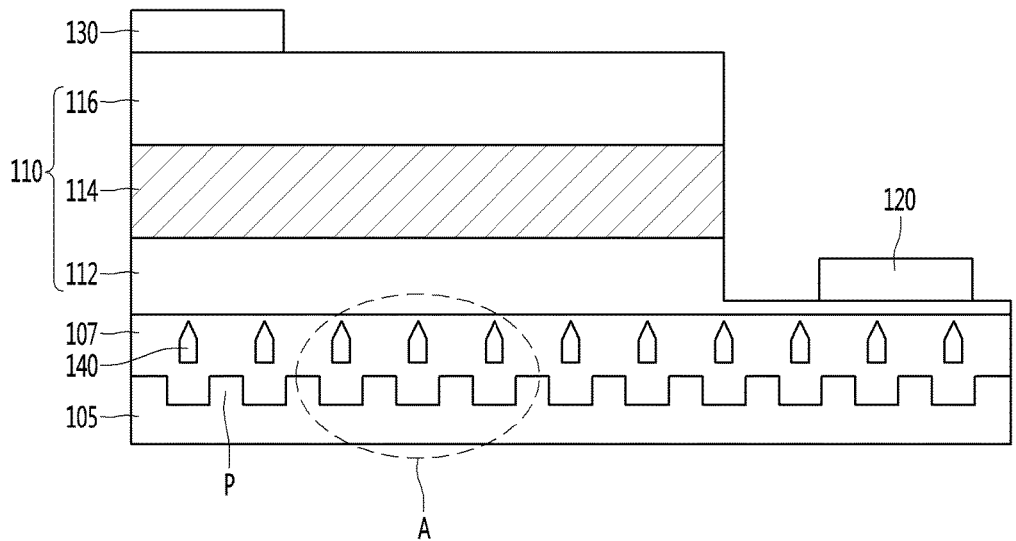
FIG. 1 is a cross-sectional view of a semiconductor device according to a first embodiment.

In the following description of the embodiment of the present invention, when a layer (or film), a region, a pattern, or a structure is referred to as being 'on/above' or "under" substrate, each layer (or film), a region, a pad, or patterns, it can be "directly" or "indirectly" on the other substrate, layer (or film), region, pad, or pattern, or one or more intervening layers may also be present. Such a position of each element will be described with reference to the drawings.

The thickness and size of each layer shown in the drawings can be exaggerated, omitted or schematically drawn for the purpose of convenience or clarity. In addition, the size of elements does not utterly reflect an actual size.

The elements of embodiments to be described below may be combined with each other. The configuration of the semiconductor device according to the first embodiment may be applied to the configuration of the semiconductor device according to the second embodiment. Conversely, the configuration of the semiconductor device according to the second embodiment may be applied to the configuration of the semiconductor device according to the first embodiment.

Figure 2:
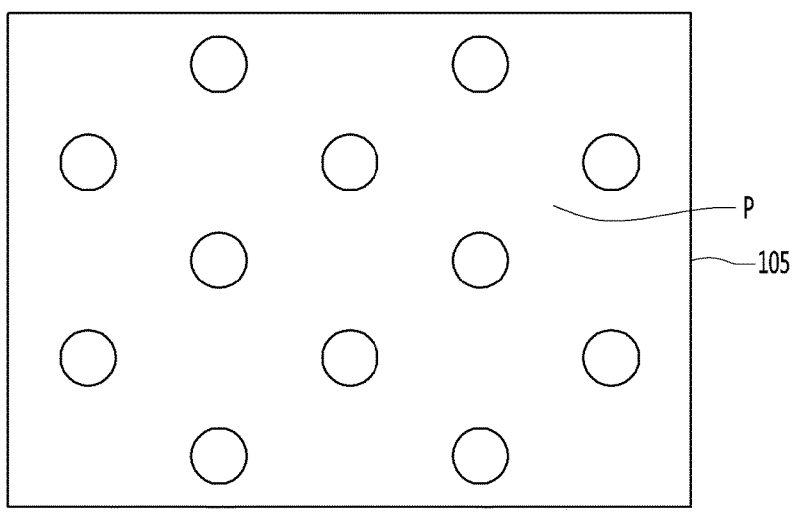
FIGS. 2 and 3 are a plan view and a perspective view showing various shapes of the substrate according to the first embodiment.
Figure 3:
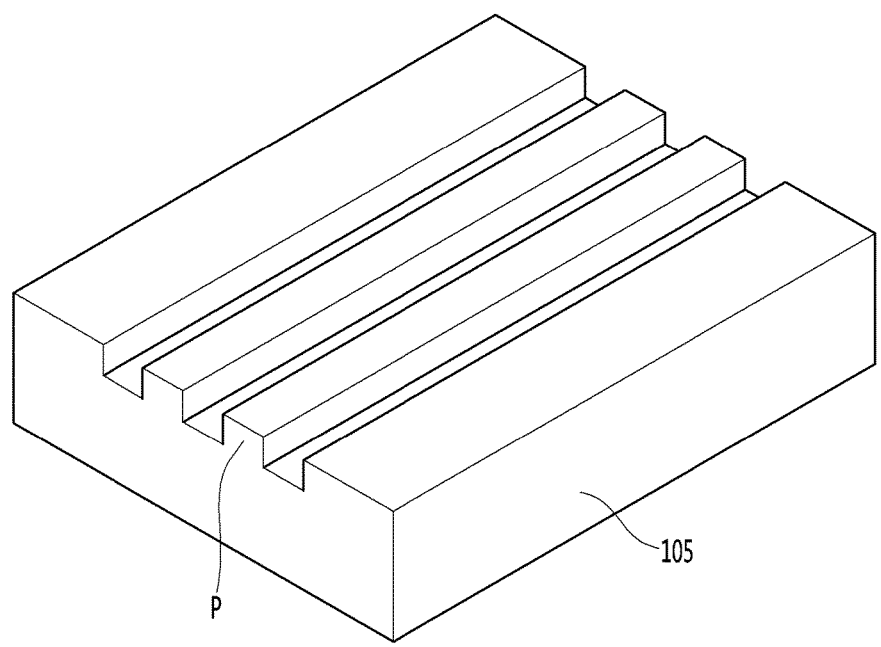

FIG. 1 is a cross-sectional view of a semiconductor device according to a first embodiment. FIGS. 2 and 3 are a plan view and a perspective view showing various shapes of the substrate according to the first embodiment. Hereinafter, an ultraviolet light emitting device employed as a semiconductor device will be described according to the embodiment. Accordingly, in the following description, the semiconductor device will be referred to as "ultraviolet light emitting device" for the convenience of explanation.

Referring to FIG. 1, according to the embodiment, the light emitting device 100 may include a substrate 105 including a concavo-convex pattern P, a buffer layer 107 including a void 140 on the substrate 105, a first conductive semiconductor layer 112 on the buffer layer 107, an active layer 114 on the first conductive semiconductor layer 112, a second conductive semiconductor layer 116 on the active layer 114, a first electrode 120 on the first conductive semiconductor layer 140, and a second electrode 130 on the second conductive semiconductor layer 116.

The void 140 may include air. The void 140 may be provided above the concavo-convex pattern P provided on the substrate 105. The void 140 may be provided above the concave pattern of the concavo-convex pattern P. The width of the void 140 may be equal to or less than the half of the width of the concave pattern in the concavo-convex pattern P, but the embodiment is not limited thereto. In other words, the width of the void 140 may correspond to the width of the concave pattern.

The sectional surface of the void 140 may be a polygonal shape which is at least one of a triangle, a pentagon, and a hexagon, but the embodiment is not limited thereto. The void 140 may include an inclined facet having a specific slope, and the uppermost portion of the inclined facet may be provided adjacent to the first conductive semiconductor layer 112.

In other words, voids are provided above the concavo-convex pattern and have uniform shapes and sizes. The voids include inclined facets having specific slops to block the threading dislocations, thereby improving the quality of the epitaxial growth of the light emitting device. In addition, the voids induce light scattering, thereby improving light extraction efficiency and improving the orientation angle.

The substrate 105 may be formed of a material representing excellent thermal conductivity. The substrate 105 may be a conductive substrate or an insulating substrate. For example, the substrate 105 may include at least one of sapphire ($Al_2O_3$), SiC, Si, GaAs, GaN, ZnO, GaP, InP, Ge, and $Ga_2O_3$. A concavo-convex structure may be formed on the substrate 105, and the sectional surface of the concavo-convex structure may be in a circular shape, an oval shape, or a polygonal shape, but the embodiment is not limited thereto.

The concave pattern of the concavo-convex pattern in the substrate 105 has the width of 0.5 μm, the width of iron may be 1.2 μm, the height of the concavo-convex pattern may be 1.2 μm, and the height of the void may be 3 μm, but the embodiment is not limited thereto.

As shown in FIG. 2, the substrate may have the concavo-convex pattern P formed by forming a plurality of circular concave patterns in the substrate. Alternatively, as shown in FIG. 3, the substrate may include the concavo-convex pattern P formed in the form of a stripe pattern extending in one direction.

In this case, the buffer layer 107 may be formed on the substrate 105. The buffer layer 107 may be interposed between the substrate 105 and the first conductive semiconductor layer 112. The buffer layer 107 may reduce the lattice mismatch between the substrate 105 and the material of the lighting emitting structure 110 to be formed in the subsequence process. The material of the buffer layer may include a group III-V compound semiconductor. In detail, the material of the buffer layer may include at least one of GaN, InN, AlN, InGaN, AlGaN, InAlGaN, and AlInN. In other words, the concavo-convex pattern P in the substrate 105 may be provided in direct contact with the buffer layer 107.

The first conductive semiconductor layer 112 may be provided on the buffer layer 107. The first conductive semiconductor layer 112 may be interposed between the buffer layer 107 and the active layer 114. The first conductive semiconductor layer 112 may be realized with a group III-V compound semiconductor doped with a first conductive dopant and has the composition formula of $In_xAl_yGa_{1-x-y}N$ ($0 \leq x \leq 1$, $0 \leq y \leq 1$, $0 \leq x+y \leq 1$). The first conductive semiconductor layer 112 may include a stack structure of layers including at least one of compound semiconductors such as GaN, InN, AlN, InGaN, AlGaN, InAlGaN, AlInN, AlGaAs, GaP, GaAs, GaAsP, and AlGaInP. The first conductive semiconductor layer 112 is an N type semiconductor, the first conductive dopant serves as an N type dopant, such as Si, Ge, Sn, Se, or Te. The electrode may be further provided on the first conductive semiconductor layer 112.

The active layer 114 may be provided on the first conductive semiconductor layer 112. The active layer 114 may be interposed between the first conductive semiconductor layer 112 and the second conductive semiconductor layer 116. The active layer 114 emits light due to the energy band gap difference according to materials constituting the active layer 114 through the combination of electrons (or holes) injected through the first conductive semiconductor layer 112 and holes (or electrons) injected through the second conductive semiconductor layer 116. The active layer 114 may have one of a single quantum well (SQW) structure, a multi-quantum well (MQW) structure, a quantum dot structure and a quantum wire structure, but the embodiment is not limited thereto.

The second conductive semiconductor layer 116 may be interposed between the active layer 114 and the second electrode 130. The second conductive semiconductor layer 116 may include a semiconductor material having the composition formula of $In_xAl_yGa_{1-x-y}N$ ($0 \leq x \leq 1$, $0 \leq y \leq 1$, $0 \leq x+y \leq 1$) doped with the second conductive dopants. The second conductive semiconductor layer 116 may include one of compound semiconductors such as GaN, InN, AlN, InGaN, AlGaN, InAlGaN, AlInN, AlGaAs, GaP, GaAs, GaAsP, and AlGaInP. The second conductive semiconductor layer 116 is a P type semiconductor, and the second conductive dopant may serve as a P type dopant, such as Mg, Zn, Ca, Sr, or Ba.

The second conductive semiconductor layer 116 may include a superlattice structure. The superlattice structure may include an InGaN/GaN superlattice structure or an AlGaN/GaN superlattice structure. The superlattice structure of the second conductive semiconductor layer 116 abnormally spreads a current by a voltage, thereby protecting the active layer.

The first electrode 120 may be provided on the first conductive semiconductor layer 112. The first electrode 120 may include at least one selected from among Cr, V, W, Ti, Zn, Ni, Cu, Al, Au, Mo, Ti/Au/Ti/Pt/Au, Ni/Au/Ti/Pt/Au, and Cr/Al/Ni/Cu/Ni/Au.

The second electrode 130 may be provided on the second conductive semiconductor layer 116 and connected with an external power source to supply power to the light emitting structure 110. The second electrode 130 may include at least one selected from among Cr, V, W, Ti, Zn, Ni, Cu, Al, Au, Mo, Ti/Au/Ti/Pt/Au, Ni/Au/Ti/Pt/Au, and Cr/Al/Ni/Cu/Ni/Au.

The ultraviolet light emitting device 100 may be classified into UV-A having a wavelength in the range of 315 nm to 400 nm, UV-B having a wavelength in the range of 280 nm to 315 nm, UV-C having a wavelength in the range of 100 nm to 280 nm. According to the embodiment of the present invention, the ultraviolet light emitting device 100 may emit the wavelength of the UV-C in the range of 100 nm to 280 nm, but the embodiment is not limited thereto.

Figure 4:
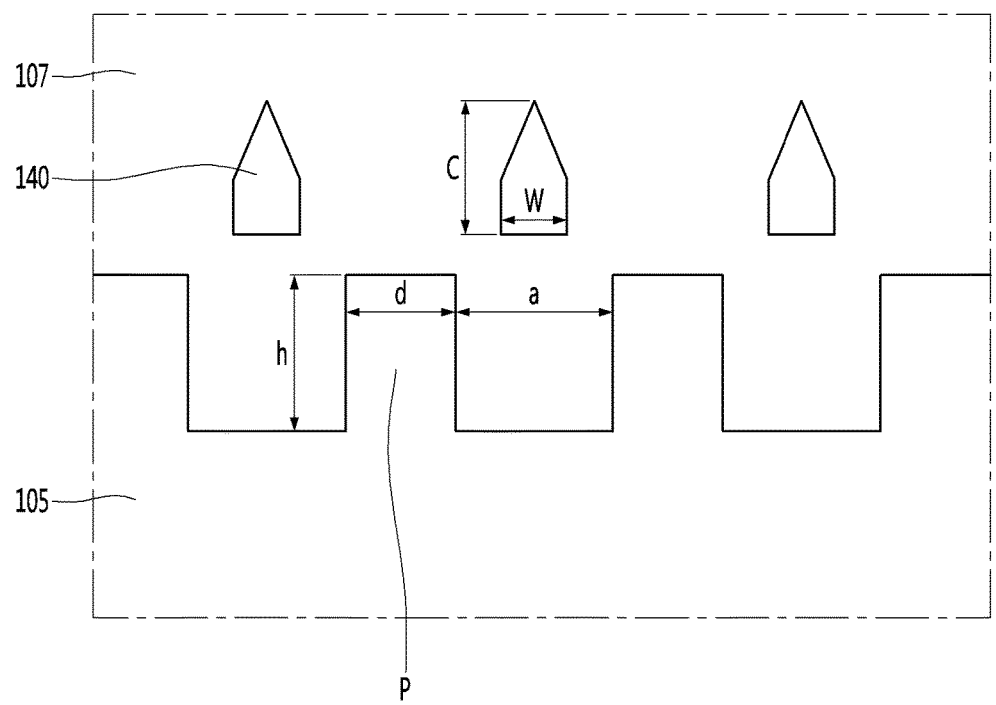
FIG. 4 is a partial enlarged view of the semiconductor device according to the first embodiment.

FIG. 4 is a partially enlarged view of a semiconductor device according to an embodiment.

Referring to FIGS. 1 and 4, the void 140 may be provided in the buffer layer 107 and above the concave pattern in the concavo-convex pattern P provided in the upper portion of the substrate 105.

The width "W" of the void 140 may be equal to or less than the half of the width "a" of the concave pattern in the concavo-convex pattern P, but the embodiment is not limited thereto. The width "w" of the void 140 may be equal to or less than 0.25 μm and the height of the void 140 may be 3 μm. The width "a" of the concave pattern may be 0.5 μm and the width d of the convex pattern may be 1.2 μm. The height of the concavo-convex pattern P may be 1.2 μm, but the embodiment is not limited thereto. In other words, the width d of the convex pattern may be two times wider than the width "a" of the concave pattern.

In other words, voids are provided above the concavo-convex pattern and have uniform shapes and sizes. The voids include inclined facets having specific slops to block the threading dislocations, thereby improving the quality of epitaxial growth of the light emitting device. The voids may induce light scattering, thereby improving light extraction efficiency and improving the orientation angle.

The void 140 may be formed to have at least two inclined facets. Although the structure having the two facets is shown in the drawing, the void 140 may have four inclined facets when the void 140 is in the shape of a quadrangular pyramid. Accordingly, the void 140 may have at least three inclined facets depending on a polyhedral structure.

Figure 5:
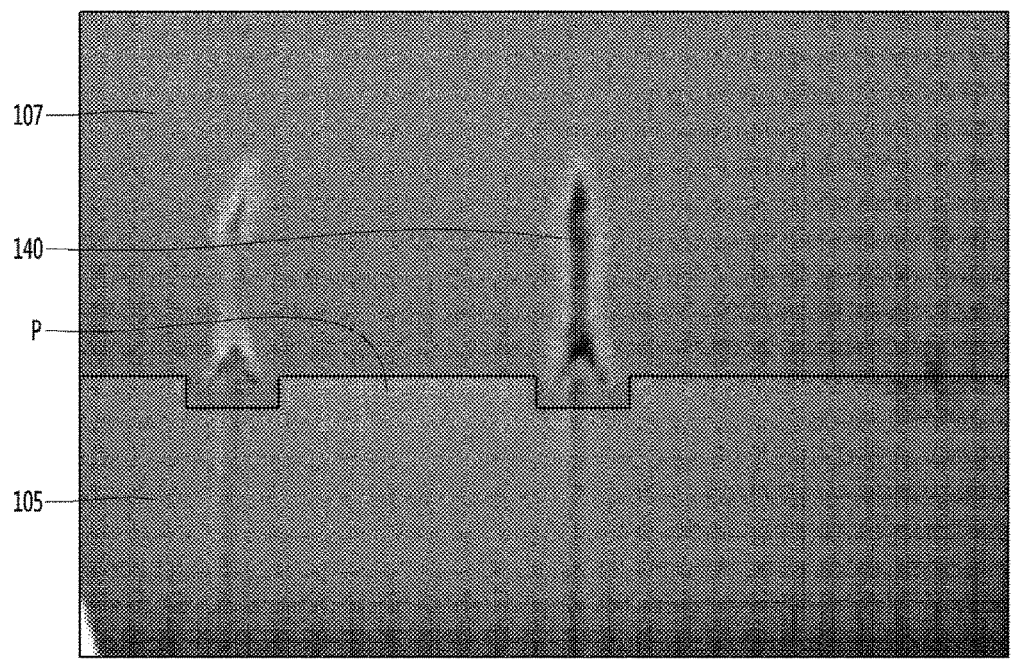
FIG. 5 is an SEM sectional view of the semiconductor device according to the first embodiment.

FIG. 5 is an SEM sectional view of the semiconductor device according to the first embodiment.

Referring to FIG. 5, the void 140 may be provided in the buffer layer 107 and above the concave pattern in the concavo-convex pattern P provided in the upper portion of the substrate 105. According to the embodiment, the void 140 may include air, and the sectional surface of the void 140 may be a polygonal shape which is at least one of a triangle, a pentagon, and a hexagon, but the embodiment is not limited thereto.

The void 140 may include an inclined facet having a specific slope, and the uppermost portion of the facet may be provided adjacent to the first conductive semiconductor layer 112.

The void 140 may have various shapes and sizes depending on the growth conditions, and are characterized in that the void having the uniform shape and size is provided above the concave part of the concavo-convex pattern P in the substrate 105.

In other words, voids having uniform shapes and sizes are provided above the concavo-convex pattern. The voids include inclined facets having specific slops to block the threading dislocations, thereby improving the quality of epitaxial growth of the light emitting device. The voids may induce light scattering, thereby improving light extraction efficiency and improving the orientation angle.

FIGS. 6 and 7 are partial enlarged views of the semiconductor device according to another embodiment.

Referring to FIGS. 6 and 7, FIG. 6 shows the light extraction pattern when the height of the void 140 is 1.2 μm, and FIG. 7 is a view showing the light extraction pattern when the height of the void 140 is 3 μm.

FIG. 6A and FIG. 7A show the case that light is incident to the void 140 horizontally from the active layer, and the scattering of the light may be more improved in the embodiment of FIG. 5 that the height of the void 140 is 3 μm, as compared to the embodiment of FIG. 4 that the height of the void 140 is 1.2 μm.

FIG. 6B and FIG. 7B show the case that light is incident to the void 140 obliquely from the active layer, and the light may be more vertically concentrated and emitted in the embodiment of FIG. 5 that the height of the void 140 is 3 μm, as compared to the embodiment of FIG. 4 that the height of the void 140 is 1.2 μm.

FIG. 6C and FIG. 7C show the case that light is incident to the void 140 vertically from the active layer, and the light may be more vertically concentrated and emitted in the embodiment of FIG. 5 that the height of the void 140 is 3 μm, as compared to the embodiment of FIG. 4 that the height of the void 140 is 1.2 μm.

In other words, as the height of the void 140 is increased, the light may be more vertically concentrated and emitted. The vertical concentration of the light may be adjusted by adjusting the height of the void 140, thereby solving the conventional problem that light is not vertically concentrated in the ultraviolet light emitting device.

Figure 8:
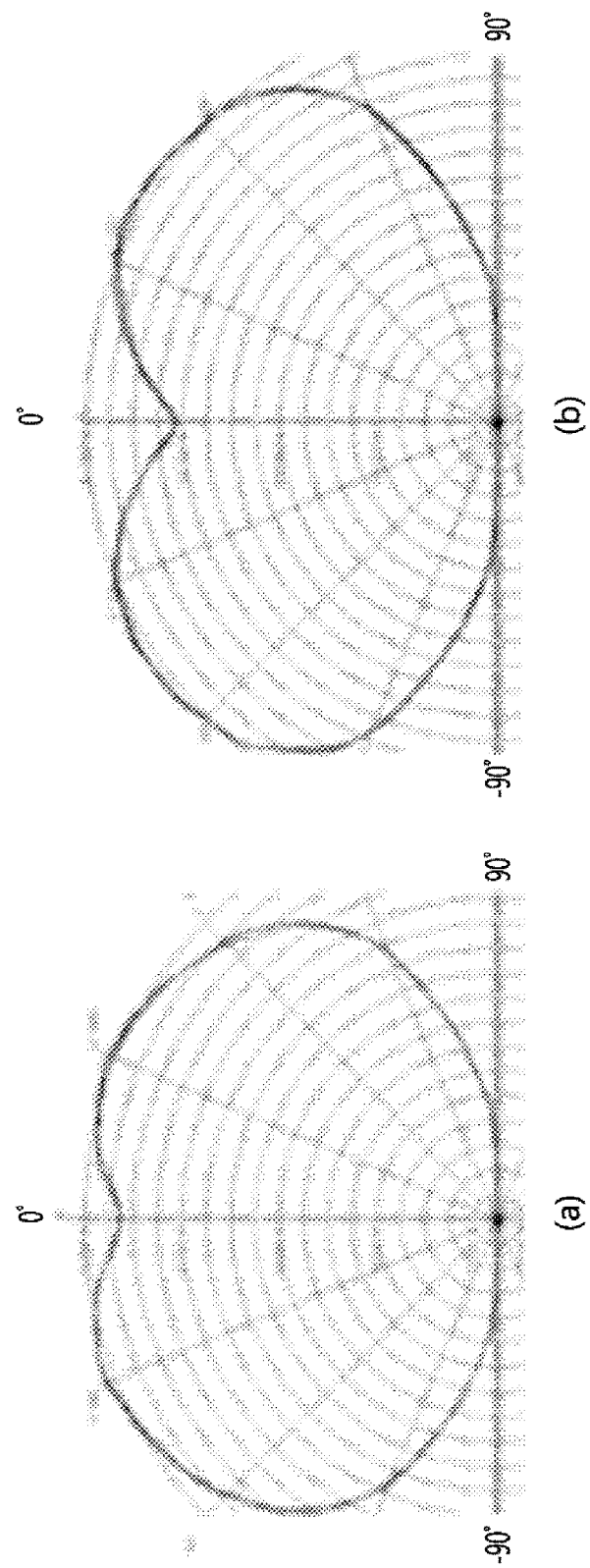
FIG. 8 is a view showing the orientation angle of the semiconductor device according to the first embodiment.

FIG. 8 is a view showing the orientation angle of the semiconductor device according to the embodiment.

Referring to FIG. 8, FIG. 8A is a view showing the orientation angle of the ultraviolet light emitting device according to the embodiment, and FIG. 8B is a view showing the orientation angle of the ultraviolet light emitting device having neither concavo-convex pattern nor void.

In the case of a light emitting device according to the embodiment as illustrated in FIG. 8, light may be concentrated at an angle of 0°, that is, in a vertical direction to more improve the light efficiency, as compared to the ultraviolet light emitting device having neither concavo-convex pattern nor void as illustrated in FIG. 8B. For example, the concentration of the light emitting element according to the embodiment of FIG. 8 (a) is 89.3% and the concentration of the ultraviolet light emitting element of FIG. 8 (b) is 68.4%. Accordingly, it can be recognized that the concentration of the light emitting element according to the embodiment of FIG. 8 (a) is more improved by 20.9%.

Figure 9:
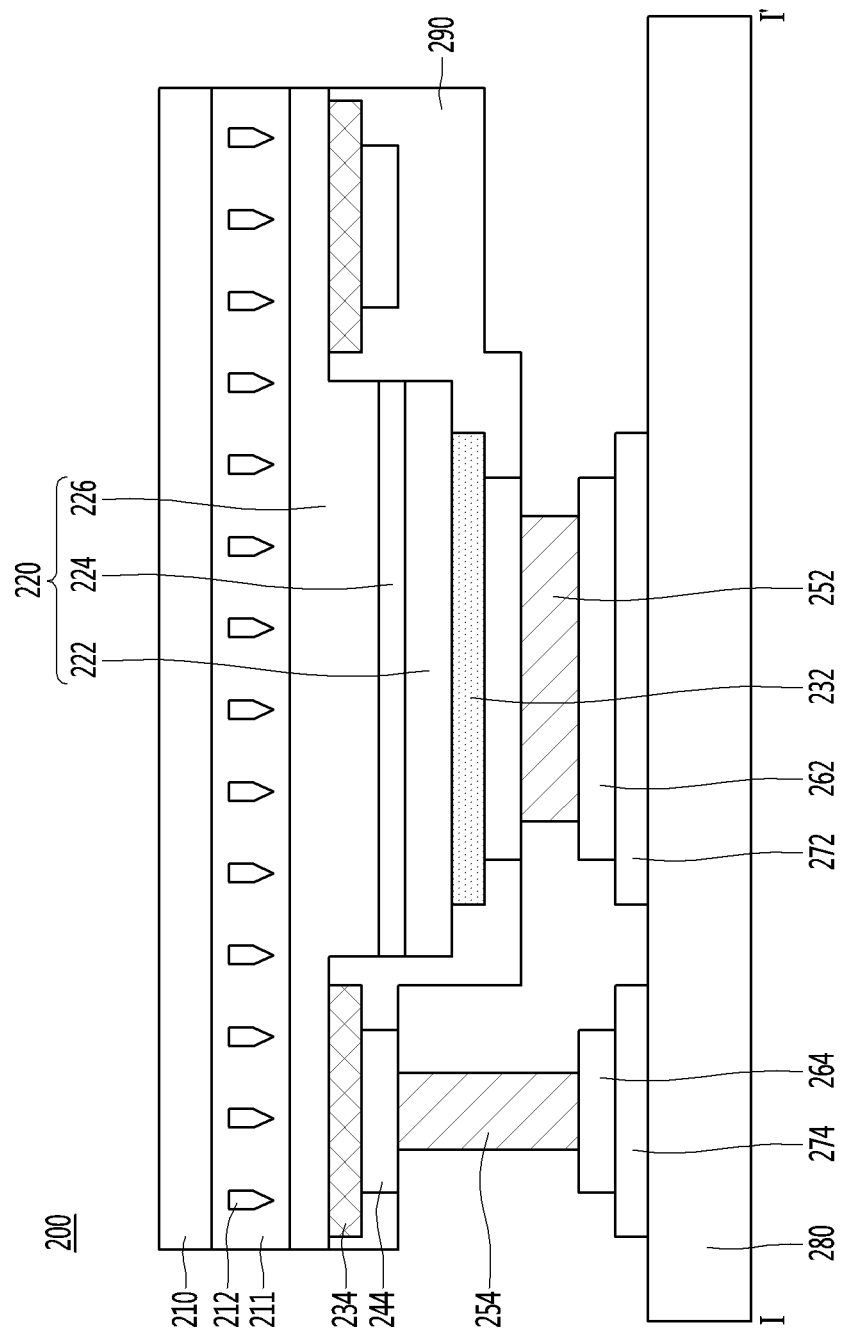
FIG. 9 is a cross-sectional view of a semiconductor device according to the second embodiment.
Figure 10:
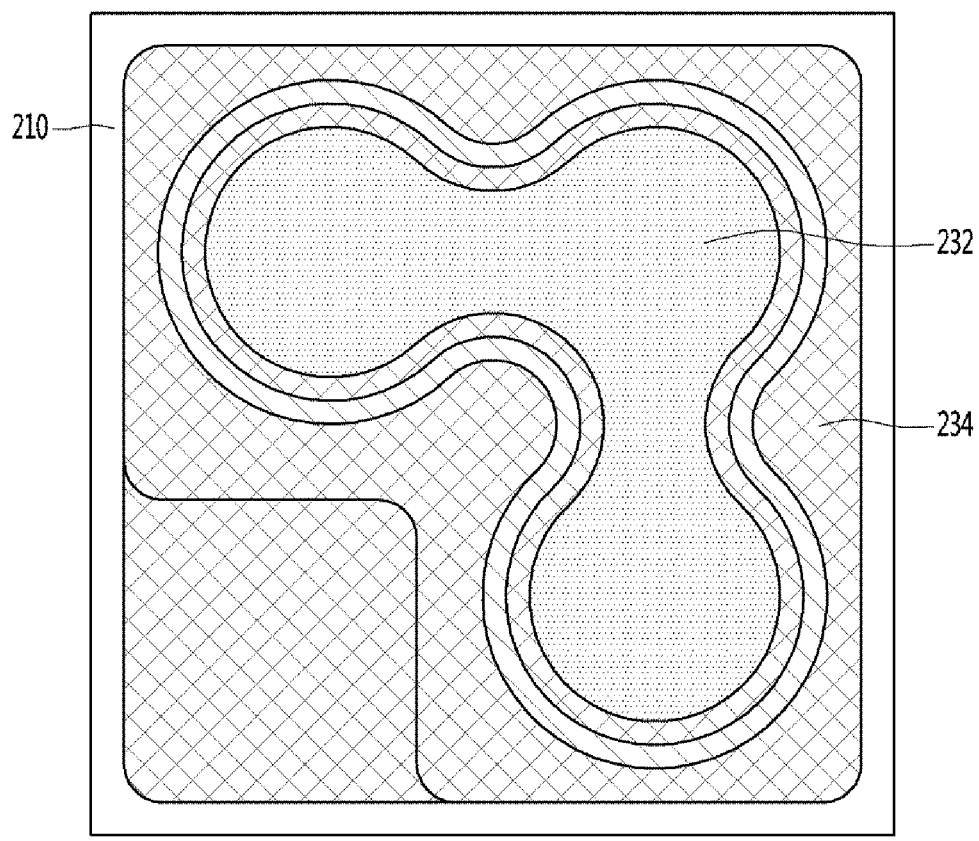
FIG. 10 is a plan view of the semiconductor device shown in FIG. 7.
Figure 11:
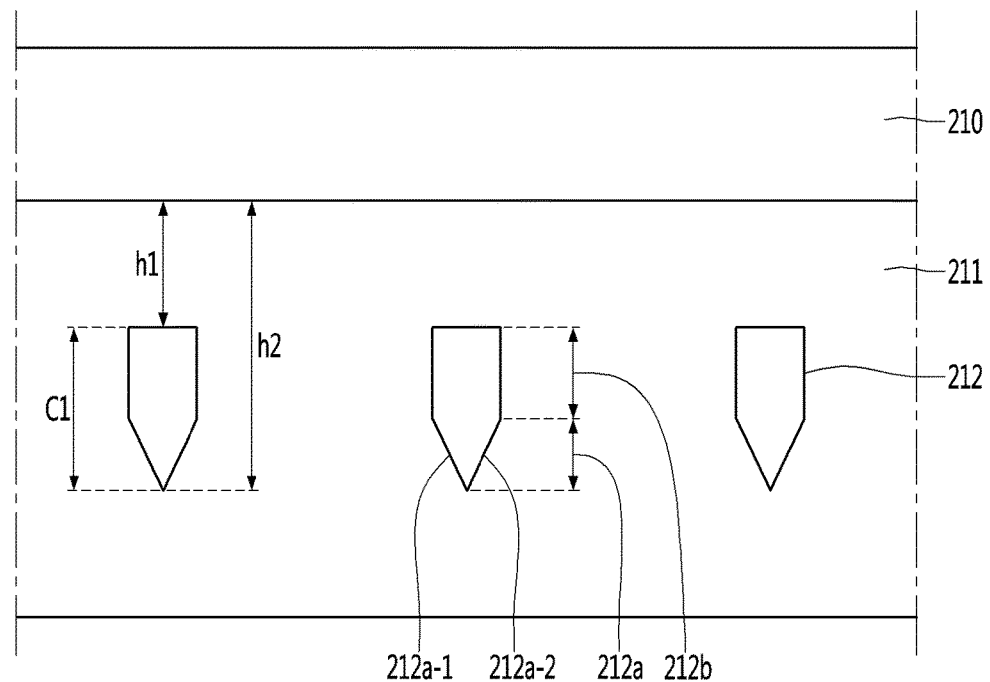
FIG. 11 is a partial enlarged view of a semiconductor device according to the second embodiment.
Figure 12:
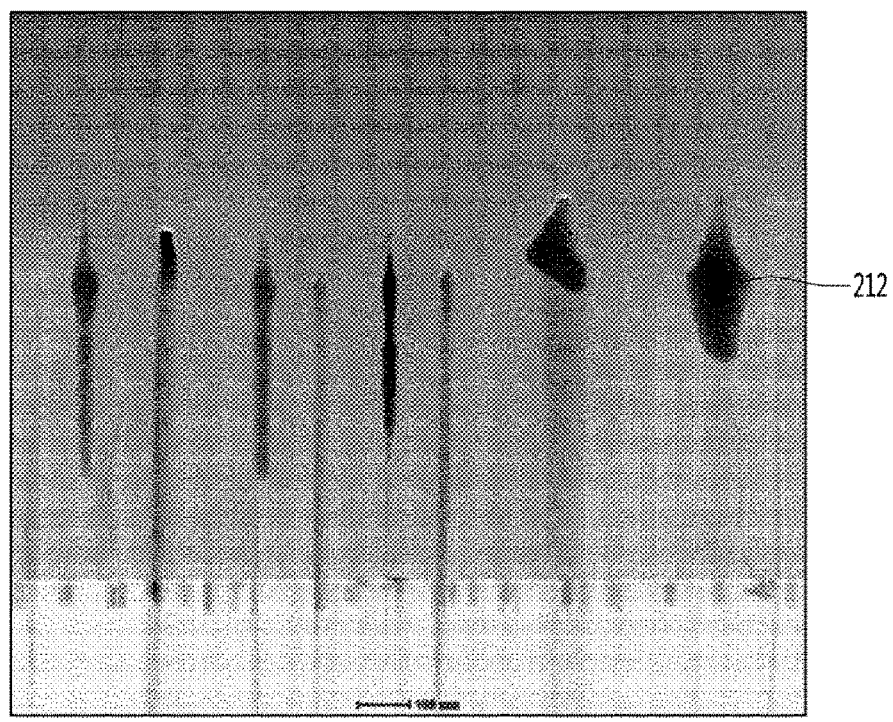
FIG. 12 is an SEM sectional view of the semiconductor device according to the second embodiment.

FIG. 9 is a cross-sectional view of a semiconductor device according to the second embodiment, FIG. 10 is a plan view of the semiconductor device shown in FIG. 9, and FIG. 11 is a partial enlarged view of a semiconductor device according to the second embodiment. FIG. 12 is an SEM sectional view of the semiconductor device according to the second embodiment.

Referring to FIG. 9, the ultraviolet light emitting device 200 according to the second embodiment includes a substrate 210, a buffer layer 211, a light emitting structure 220, first and second contact layers (or electrodes) 234 and 232, first and second spread layers 244 and 242, a first bump 254, a second bump 252, first and second metal pads 264 and 262, first and second insulating layers 274 and 272, and a sub-mount 280.

The light emitting structure 220 is provided under the substrate 210. In other words, the light emitting structure 220 may be provided between the substrate 210 and the sub-mount 280. The light emitting structure 220 may include a first conductive semiconductor layer 226, a second conductive semiconductor layer 222, and an active layer 224 between the first conductive semiconductor layer 226 and the second conductive semiconductor layer 222.

In order to improve the difference in coefficient of thermal expansion (CTE) between the substrate 210 and the light emitting structure 220 and the lattice mismatch between the substrate 210 and the light emitting structure 220, a buffer layer 211 may be interposed between the substrate 110 and the light emitting structure 220. The buffer layer 211 may be interposed between the substrate 210 and the first conductive semiconductor layer 226. A void 212 may be formed in the buffer layer 211.

As illustrated in FIG. 11, the void 212 may include a first region 212a adjacent the first conductive semiconductor layer 112 and a second region 212b adjacent to the substrate 210.

The first region 212a includes a region including at least two inclined facets 212a-1 and 212a-2. For example, the first region 212a may have a triangular sectional surface. When the first region 212a is in the shape of a triangular pyramid, three inclined facets may be formed. When the first region 212a is in the shape of a square pyramid, four inclined facets may be formed. In other words, the first region 212a may be referred to as a region having at least two inclined facets due to the shape of a polygonal pyramid.

The second region 212b may have no inclined facet. The second region 212b may be a region adjacent to the substrate 210. For example, the first region 212a may have a rectangular sectional surface.

The void 212 may be provided at a first distance h1 from the substrate 210. For example, the first distance h1 between the top surface of the second region 212b of the void 212 and the bottom surface of the substrate 210 may be in the range of 200 nm and 300 nm. When the first distance h1 is less than 200 nm, the void 212 becomes excessively closer to the substrate 210 and then crystallinity may be lowered when the buffer layer 211 is formed. The light extraction efficiency and the orientation angle characteristics of the semiconductor device may be deteriorated since the distance h1 is too shorter to widely diffuse the light scattered in the void 212.

When the first distance h1 exceeds 300 nm, since the buffer layer 211 has to be formed with a thicker thickness, the stress applied to the upper portion of the buffer layer 211 is increased to change the wavelength of the active layer, thereby degrading the light emission efficiency (WPE) of the semiconductor device.

The second distance h2 from one surface of the substrate 210 to the end of the first region 212a of the void 212 may be in the range of 500 nm to 1200 nm. The height C1 of the void 212 may be in the range of 500 nm to 900 nm. When the height C1 of the void 212 is less than 500 nm, since the first conductive semiconductor layer 226 is merged significantly sharply into the facet of the first region 212a of the void 212 in the horizontal direction, the crystallinity of the light emitting structure 220 may be degraded. When the height C1 of the void 212 is greater than 900 nm, the stress applied to the light emitting structure 220 is increased due to the buffer layer 211, which is excessively thick, to change the wavelength of the light emitted from the active layer 224, thereby degrading the light emission efficiency of the semiconductor device.

Since the light emitting device according to the second embodiment has a flip chip bonding structure of extracting light in a substrate direction, the distance between the substrate and the void and the size of the void may be different from the void formed in the light emitting device according to the first embodiment. In other words, in the case of the light emitting device according to the second embodiment, when the distance between the bottom surface of the substrate and the top surface of the void is in the range of 200 nm to 300 nm, the light emitting device having the flip chip bonding structure represents the most effective light extraction efficiency.

In other words, in the case of the light emitting device having the flip chip bonding structure, light emitted from the active layer is output toward the substrate while being reflected by the reflective layer under the active layer to be output toward the substrate. Accordingly, the light reflected toward the substrate may represent improved light extraction efficiency due to the difference in refractive index between the void and the substrate and the scattering of the light on the interfacial surface of the void.

The voids 212 may be formed in different sizes. The voids 212 may have different heights and widths within ±30% of the sectional area on the same line. The sectional area on the same line may include not only the sectional area of the central region of the void 212, but also the sectional area set for measurement.

As shown in FIG. 12, regarding the actual shape of the void 212, it may be recognized that the void 212 has various shapes having two or more facets, and that the sizes thereof are formed to be different from each other.

As described above, it may be recognized that the voids 212 are spaced apart from the substrate by a distance in the range of 200 nm to 300 nm and are arranged in various shapes with sizes within ±30% of the sectional area on the same line.

Referring back to FIG. 9, the light emitting structure 220 may include a first conductive semiconductor layer 226, an active layer 224, and a second conductive semiconductor layer 222. The first conductive semiconductor layer 226 may be interposed between the buffer layer 211 and the active layer 224. The active layer 224 may be interposed between the first conductive semiconductor layer 226 and the second conductive semiconductor layer 222. When the first conductive semiconductor layer 226 is in an N type, the second conductive semiconductor layer 222 may be in a P type. Conversely, when the first conductive semiconductor layer 226 is P type, the second conductive semiconductor layer 222 may be N type.

Since the light emitting device according to the second embodiment has a flip chip bonding structure, light emitted from the active layer 224 is transmitted through the first contact layer 234, the first conductive semiconductor layer 226, and the substrate 110. To this end, the first contact layer 234, the first conductive semiconductor layer 226, and the substrate 210 may be formed of a material having a light transmittance property. In this case, the second conductive semiconductor layer 222 and the second contact layer 232 may be formed of a material having a light transmittance property or an opaque property, but the embodiments may not be limited to specific materials.

The sub-mount 280 may be provided while facing the substrate 210. The sub-mount 280 may be provided under the substrate 210. The sub-mount 280 may be formed of a semiconductor substrate such as AlN, BN, SiC, GaN, GaAs, or Si, but the embodiment is not limited thereto. For example, the sub-mount 280 may include a semiconductor material having excellent thermal conductivity. In addition, a device for preventing electrostatic discharge (ESD) may be included in the form of a zener diode in the sub-mount 280.

The first and second metal pads 264 and 262 are provided on the sub-mount 280 and may be electrically isolated from each other. Each of the first and second metal pads 264 and 262 may be formed of metal materials having electrical conductivity.

The first and second insulating layers 274 and 272 are interposed between the first and second metal pads 264 and 262 and the sub-mount 280, respectively. The first and second insulating layers 274 and 272 may be provided on another side of the active layer adjacent to the void. When the sub-mount 280 is formed of a material, such as Si, having electrical conductivity, the first and second insulating layers 274 and 272 may be provided to electrically isolate the first and second metal pads 264 and 262 from the sub-mount 280. In this case, the first and second insulating layers 274 and 272 may include materials having electrical insulation properties.

In addition, the first and second insulating layers 274 and 272 may be formed of materials having not only the electrical insulation properties but also optical reflection characteristics. Therefore, the first and second insulating layers 274 and 272 may be reflective layers. For example, each of the first and second insulating layers 274 and 272 may include distributed bragg reflectors (DBR). In this case, the DBR may perform an insulting function or a reflection function. The DBR may be a structure formed by alternately stacking first and second layers having mutually different refractive indexes at least one time. Each DBR may include an electrical insulation material. For example, the first layer may be a first dielectric layer, such as $TiO_2$, and the second layer may include a second dielectric layer, such as $SiO_2$. In other words, the DBR may be a structure formed by stacking a $TiO_2/SiO2$ layer at least one time. The thickness of each of the first and second dielectric layers is $\lambda/4$, and $\lambda$ may be a wavelength of light emitted from a light emitting cell.

In addition, each of the first and second insulating layers 274 and 272 may include at least one of $SiO_2$, $TiO_2$, $ZrO_2$, $Si_3N_4$, $Al_2O_3$, or $MgF_2$, but the embodiment is not limited thereto.

At least one bump may be interposed between the light emitting structure 220 and the sub-mount 280. In other words, first and second bumps 254 and 252 may be interposed between the light emitting structure 220 and the sub-mount 280.

The first bump 254 may be interposed between the first metal pad 264 and a first spread layer 244. The number of the first bumps 254 may be one or the plural.

The second bump 252 may be interposed between the second metal pad 262 and the second spread layer 242.

At least one or more contact layers may be interposed between the at least one bump and the light emitting structure 220. For example, first and second contact layers 234 and 232 may be interposed between the light emitting structure 220 and the first and second bumps 254 and 252, respectively.

The second contact layer 232 may be interposed between the second bump 252 and the light emitting structure 220 via the second spread layer 242. The second contact layer 232 may be interposed between the second spread layer 242 and the second conductive semiconductor layer 222. The second contact layer 232 may electrically connect the second spread layer 242 with the second conductive semiconductor layer 222. To this end, as illustrated in drawings, the second contact layer 232 may be in contact with the second conductive semiconductor layer 222.

The first contact layer 234 may be provided under the first conductive semiconductor layer 226 exposed by mesa etching and may be interposed between the first bump 254 and the first conductive semiconductor layer 226 of the light emitting structure 320 via the first spread layer 244. The first contact layer 234 may electrically connect the first spread layer 244 with the first conductive semiconductor layer 226. The first contact layer 234 may function as an ohmic contact with the ohmic contact material and may be electrically connected with the first conductive semiconductor layer 226. A separate ohmic layer may be over or under the first contact layer 234.

FIG. 10 is a plan view of the light emitting device 200 of FIG. 9 when viewed from the sub-mount 280 toward the light emitting structure 220. The first and second spread layers 244 and 242, the first and second bumps 254 and 252, the first and second metal pads 264 and 262, the first and second insulating layers 274 and 272, and the sub-mount 280, which are shown in FIG. 9, are omitted in FIG. 10.

As shown in FIG. 10, the second contact layer 232 may have a structure in which a plurality of electrode patterns having specific shapes without vertexes are connected with each other. For example, the second contact layer 232 may have the structure in which the specific number of electrode patterns provided in a specific shape form a triangular structure. The electrode patterns have no vertex to improve the reliability of the device by preventing the concentration of an electric field (E-field) which may be generated at the vertex.

In addition, when the electrode patterns are increased, the area which may be in contact with the bump has to be considered. Accordingly, the use of the electrode patterns in specific number or more is not preferred. Therefore, the number of electrode patterns may be appropriately designed depending on the area of the device and the area of the bumps.

The area of the second contact layer 232 may occupy 30% to 50% of the total device area. The electrode pattern may be formed to have 25% to 35% of the area of the second contact layer 232. When the area of the second contact layer 232 is excessively narrow, the current injection efficiency is lowered and the electrical characteristics are lowered. On the other hand, when the area of the second contact layer 232 is excessively wide, the area in which the first contact layer 234 is arranged is reduced and thus the electrical and optical characteristics may be deteriorated.

The area of the first contact layer 234 may occupy 40% to 60% of the total device area. When the area of the first contact layer 234 is excessively narrow, the current injection efficiency may be lowered and thus the electrical and optical characteristics may be deteriorated. On the other hand, when the area of the first contact layer 234 is excessively wide, the area of the active layer 224 to be removed may be increased and thus the optical characteristics may be deteriorated.

The area of the second contact layer 232 may be formed to be smaller than the area of the first contact layer 234 and the ratio between the area of the second contact layer 232 and the area of the first contact layer 234 may be 1:1.3 to 1:2. In other words, when the ratio between the area of the second contact layer 232 and the area of the first contact layer 234 are less than 1:1.3 or more than 1:2, the electrical characteristics and optical characteristics may be deteriorated.

The first and second contact layers 234 and 232 may be formed of any material that may be excellently grown on the first and second conductive semiconductor layers 226 and 222. For example, each of the first and second contact layers 232 and 234 may be formed of metal, and may be formed of Ag, Ni, Al, Rh, Pd, Ir, Ru, Mg, Zn, Pt, Au, Hf, or the combination of elements selected from Ag, Ni, Al, Rh, Pd, Ir, Ru, Mg, Zn, Pt, Au, and Hf In particular, the second contact layer 232 may include a reflective material. For example, the second contact layer 232 may include a transparent electrode (not shown) and a reflective layer (not shown). The reflective layer may be made of a reflective material such as silver (Ag).

The second contact layer 232 may have an ohmic characteristic and may include a material that makes an ohmic contact with the second conductive semiconductor layer 222. When the second contact layer 232 performs an ohmic function, a separate ohmic layer (not shown) may not be formed.

At least one spread layer may be interposed between at least one contact layer and at least one bump.

The second spread layer 242 may be interposed between the second contact layer 232 and the second bump 252. The first spread layer 244 may be interposed between the first contact layer 234 and the first bump 254. The first and second spread layers 244 and 242 may prevent the increase of the resistance of the light emitting structure 220 because the electrical characteristic of the light emitting structure 220 may be deteriorated as the resistance of the light emitting structure 220 is increased due to the heat emitted from the light emitting structure 220. To this end, the first and second spread layers 244 and 242 may be formed of a material having excellent electrical conductivity.

A protective layer 290 may be formed on a region without the second spread layer 242 and the first spread layer 244 to cover the top of the light emitting structure 220. The protective layer 290 may be formed to expose only a portion of the second spread layer 242. The protective layer 290 may include an insulating layer FIG. 13 is a sectional view of a semiconductor device package according to the second embodiment.

Figure 13:
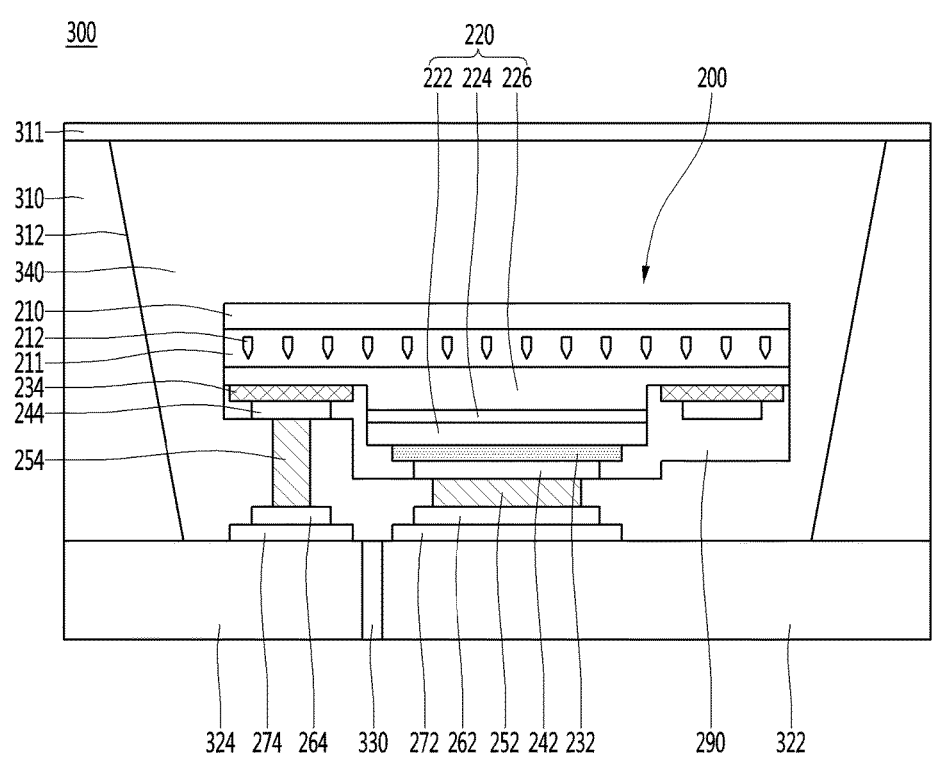
FIG. 13 is a cross-sectional view of a semiconductor device package according to the second embodiment.

Referring to FIG. 13, a light emitting device package 300 includes a light emitting device 200, a package body 310, first and second lead frames 322 and 324, a third insulating layer 330, and first and second wires 352 and 354, respectively. The light emitting device 200 may correspond to the light emitting device 200 shown in FIGS. 9 to 12.

The package body 310 shown in FIG. 13 may form a cavity 340. The cavity 340 may include air. For example, the package body 310 may form the cavity 340 together with the first and second lead frames 322 and 324. In other words, the cavity 340 may be defined by side surfaces 312 of the package body 310 and top surfaces of the first and second lead frames 322 and 324, respectively. However, the embodiment is not limited thereto.

According to another embodiment, the cavity 340 may be formed by only the package body 310, unlike the structure shown in FIG. 13. Alternatively, a barrier wall (not shown) may be provided on the package body 310 having a flat top surface, and a cavity may be defined by the barrier wall and the top surface of the package body 310. The package body 310 may be implemented with an epoxy molding compound (EMC) or the like, but the embodiment is not limited to the material of the package body 310. The light emitting device 100A may be provided inside the cavity 340.

A cover 311 formed of a glass material is provided on the package body 310 to cover the cavity 340, thereby ensuring a space for the cavity 340.

The first and second lead frames 322 and 324 may be spaced apart from each other in the horizontal direction. Each of the first and second lead frames 322 and 324 may be formed of a conductive material, for example, metal, and the embodiment is not limited to the type of material of each of the first and second lead frames 322 and 324. A third insulating layer 330 may be interposed between the first and second lead frames 322 and 324 to electrically isolate the first and second lead frames 322 and 324 from each other.

When the package body 310 is formed of the conductive material, for example, metal, the first and second lead frames 322 and 324 may be portions of the package body 310. In this case, the package body 310 forming the first and second lead frames 322 and 324 can be electrically separated from each other by the third insulating layer 330.

The first and second metal pads 272 and 274 connected with the first and second conductive semiconductor layers 226 and 222 through the first and second bumps 252A and 254 may be electrically connected with the first and second lead frames 322 and 324 through wires 352 and 354, respectively.

According to the embodiment, a plurality of light emitting device packages may be arrayed and a light guide plate, a prism sheet, or a diffusion sheet may be arranged on an optical path of the light emitting device package. The light emitting device package, the substrate, or the optical member may function as a lighting system or a vehicle lamp.

Figure 14:
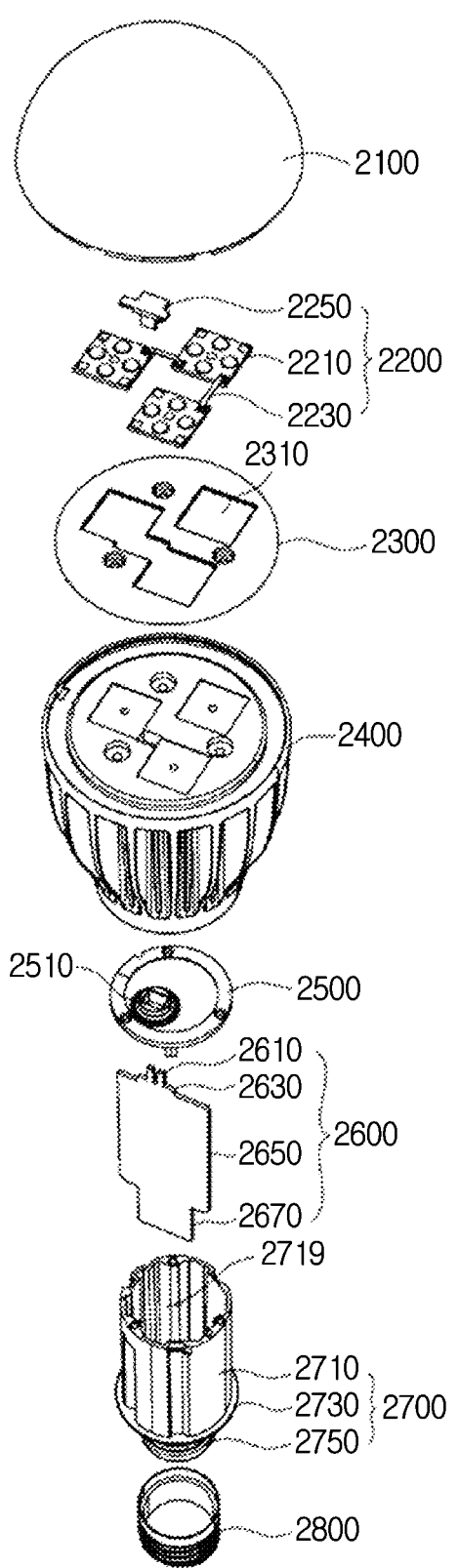
FIGS. 14 and 15 are exploded perspective views showing embodiments of the lighting system including the semiconductor device according to the embodiment.
Figure 15:
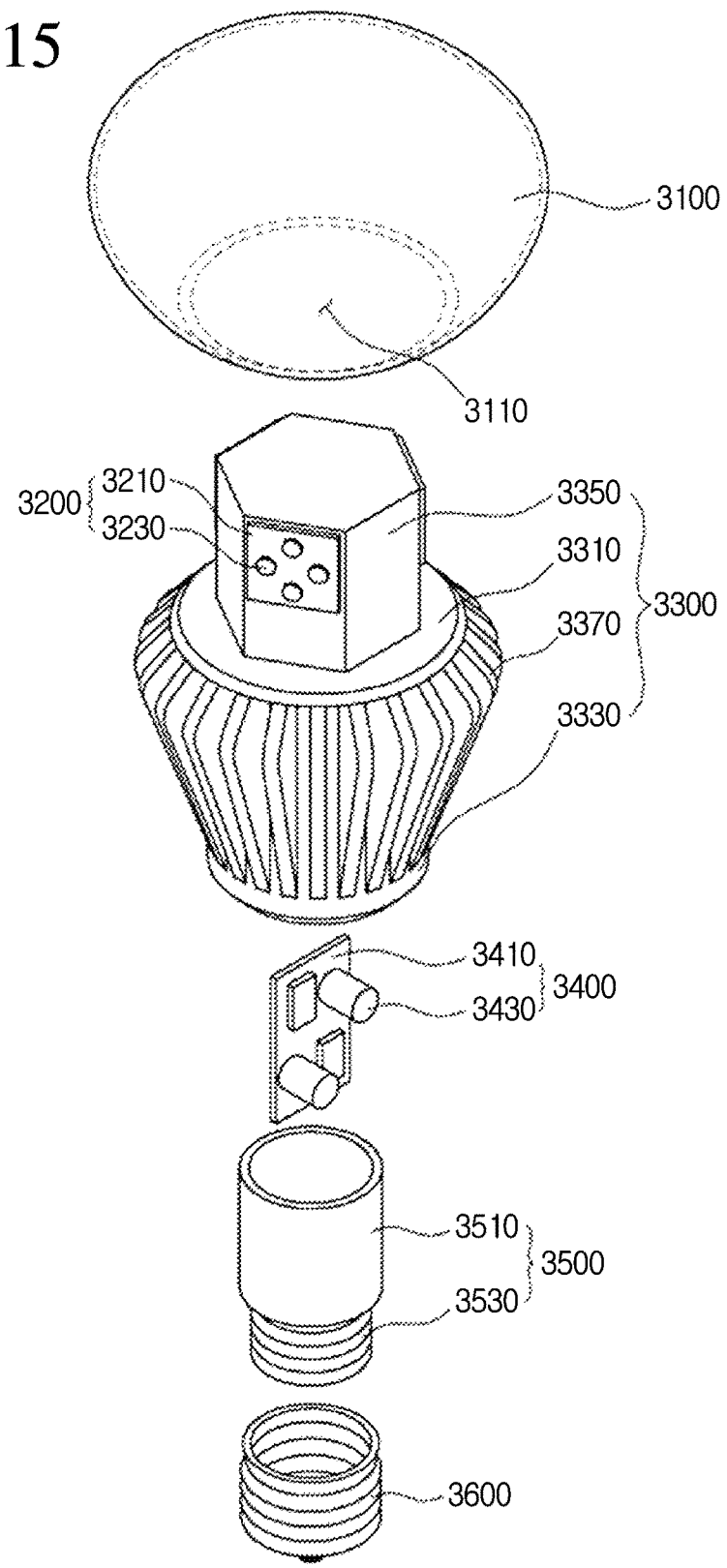

FIGS. 14 and 15 are exploded perspective views showing examples of a lighting system including a semiconductor device according to the embodiment.

As shown in FIG. 14, the lighting system according to the embodiment may include a cover 2100, a light source module 2200, a heat radiator 2400, a power supply unit 2600, an inner case 2700, and a socket 2800. The lighting system according to the embodiment may further include at least one of a member 2300 and a holder 2500. The light source module 2200 may include the light emitting device 100 or the light emitting device package 200 according to the embodiment.

As shown in FIG. 15, the lighting device according to the embodiment may include a cover 3100, a light source unit 3200, a heat radiator 3300, a circuit part 3400, an inner case 3500, and a socket 3600. The light source unit 3200 may include the light emitting device or the light emitting device package according to the embodiment.

INDUSTRIAL APPLICABILITY

The embodiment may be applicable to a flat panel lighting device.

The embodiment may be applicable to a flat panel lighting device having a light emitting device.

The embodiment may be applicable to a vehicle lamp having a light emitting device.

The invention claimed is:

1. A semiconductor device comprising:
a substrate;
a buffer layer provided on the substrate;
a light emitting structure provided on the buffer layer and including a first conductive semiconductor layer, a second conductive semiconductor layer, and an active layer interposed between the first conductive semiconductor layer and the second conductive semiconductor layer to emit ultraviolet light;
a plurality of air voids provided in the buffer layer; and
wherein each of the air voids has at least two inclined facets, which are different from each other based on the substrate,
wherein the at least two inclined facets of the air voids are provided to face the light emitting structure,
wherein the substrate includes a concavo-convex pattern, a portion of the buffer layer is provided in a concave pattern of the concavo-convex pattern, and the air voids are positioned above the portion of the buffer layer in the concave pattern, and
wherein the air voids are spaced apart from the concavo-convex pattern.

2. The semiconductor device of claim 1, wherein the buffer layer includes a first region adjacent to the first conductive semiconductor layer and a second region adjacent to the substrate, and
wherein the at least two inclined facets are provided in the first region.

3. The semiconductor device of claim 2, wherein a distance between the substrate and the air voids ranges from 200 nm to 300 nm.

4. The semiconductor device of claim 3, wherein a distance between the substrate and an end portion of a first region of the air voids ranges from 800 nm to 900 nm.

5. The semiconductor device of claim 1,
wherein a width of each of the air voids corresponds to a width of the concave pattern.

6. The light emitting device of claim 1, wherein the width of each of the air voids is equal to or less than a half of the width of the concave pattern of the concavo-convex pattern in the substrate.

7. The semiconductor device of claim 1, wherein an uppermost portion of the inclined facet is positioned adjacent to the first conductive semiconductor layer.

8. The semiconductor device of claim 1, wherein the concave pattern of the concavo-convex pattern has the width of 0.5 µm, a convex pattern of the concavo-convex pattern has a width of 1.2 µm, and the concavo-convex pattern has a height of 1.2 µm,
wherein each of the air voids has a height of 3 µm.

9. A semiconductor device package comprising:
a substrate;
a buffer layer provided on the substrate;
a light emitting structure provided on the buffer layer and including a first conductivity type semiconductor layer, a second conductivity type semiconductor layer, and an active layer provided between the first conductivity type semiconductor layer and the second conductivity type semiconductor layer;
a sub-mount provided on the light emitting structure;
a first bump provided between the light emitting structure and the sub-mount, and electrically connected to the first conductivity type semiconductor layer;
a second bump provided between the light emitting structure and the sub-mount, and electrically connected to the second conductivity type semiconductor layer,
wherein the buffer layer includes a plurality of air voids,
wherein each of the air voids includes at least two inclined facets,
wherein the substrate includes a concavo-convex pattern, a portion of the buffer layer is provided in a concave pattern of the concavo-convex pattern, and the air voids are positioned above the portion of the buffer layer in the concave pattern, and
wherein the air voids are spaced apart from the concavo-convex pattern.

10. The semiconductor device package of claim 9,
wherein each of the air voids includes a top portion and a bottom portion,
wherein at least two inclined facets are provided in the top portion, and
wherein the bottom portion is positioned closer to the substrate than the top portion.

11. The semiconductor device package of claim 10, wherein a distance between the substrate and the air voids ranges from 200 nm to 300 nm.

12. The semiconductor device package of claim 10, wherein a distance between the substrate and an end portion of the air voids ranges from 800 nm to 900 nm.

13. The semiconductor device package of claim 9, wherein the air voids are formed in dimensions of different heights and widths, and the dimensions are within ±30% of a whole area.

14. The semiconductor device package of claim 10,
wherein a reflective layer is provided on a bottom surface of the sub-mount, and
wherein the at least two inclined facets of the air voids are provided to face the reflective layer.

15. The semiconductor device package of claims 14, wherein:
at least one contact layer interposed between the light emitting structure and at least one of the first bump or the second bump, and
at least one spread layer interposed between the at least one contact layer and the at least one of the first bump or the second bump.

16. The semiconductor device package of claim 15,
wherein a first metal pad is interposed between the sub-mount and the first bump, and
wherein a second metal pad is interposed between the sub-mount and the second bump.

17. The semiconductor device package of claim 16,
wherein at least one insulating layer is interposed between the sub-mount and each of the first metal pad and the second metal pad.
18. The semiconductor device package of claim 10,
wherein the buffer layer includes aluminum nitride (AlN), and
wherein the active layer emits a light having a peak wavelength between 200 nm and 400 nm.
19. The semiconductor device of claim 1,
wherein a reflective layer provided at a side of the active layer in opposition to the air voids.
20. The semiconductor device of claim 19,
wherein the at least two inclined facets of the air voids are provided to face the reflective layer.

* * * * *